(12) United States Patent
Hurley et al.

(10) Patent No.: US 8,987,039 B2
(45) Date of Patent: Mar. 24, 2015

(54) ANTIREFLECTIVE COATINGS FOR PHOTOVOLTAIC APPLICATIONS

(75) Inventors: Patrick Timothy Hurley, Allentown, PA (US); Robert Gordon Ridgeway, Quakertown, PA (US); Raymond Nicholas Vrtis, Orefield, PA (US); Mark Leonard O'Neill, Allentown, PA (US); Andrew David Johnson, Doylestown, PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 856 days.

(21) Appl. No.: 12/244,455

(22) Filed: Oct. 2, 2008

(65) Prior Publication Data

US 2009/0095346 A1    Apr. 16, 2009

Related U.S. Application Data

(60) Provisional application No. 60/979,585, filed on Oct. 12, 2007.

(51) Int. Cl.
*H01L 31/18* (2006.01)
*C23C 16/30* (2006.01)
(Continued)

(52) U.S. Cl.
CPC ............ *C23C 16/30* (2013.01); *H01L 21/3148* (2013.01); *H01L 31/02168* (2013.01); *H01L 31/0236* (2013.01); *H01L 31/18* (2013.01); *Y02E 10/50* (2013.01)
USPC ............. 438/72; 136/252; 136/253; 136/256; 257/E31.127

(58) Field of Classification Search
CPC . C23C 16/30; H01L 21/3148; H01L 31/0236; H01L 31/18; H01L 31/02168; Y02E 10/50

USPC .................... 136/256; 438/72; 257/E31.127
See application file for complete search history.

(56) References Cited

U.S. PATENT DOCUMENTS

| 5,472,827 A | 12/1995 | Ogawa et al. |
| 5,616,374 A | 4/1997 | Sho |

(Continued)

FOREIGN PATENT DOCUMENTS

| CN | 10-1044630 A | 9/2007 |
| EP | 0 771 886 A1 | 5/1997 |

(Continued)

OTHER PUBLICATIONS

Smith et al., "Thermal Chemical Vapor Deposition of Bis(Tertiary0Butylamino)Silane-based Silicon Nitride Thin Films", Journal of the Electrochemical Society, 2005.*

(Continued)

*Primary Examiner* — Matthew Martin
(74) *Attorney, Agent, or Firm* — Lina Yang

(57) ABSTRACT

A process is provided for making a photovoltaic device comprising a silicon substrate comprising a p-n junction, the process comprising the steps of: forming an amorphous silicon carbide antireflective coating over at least one surface of the silicon substrate by chemical vapor deposition of a composition comprising a precursor selected from the group consisting of an organosilane, an aminosilane, and mixtures thereof, wherein the amorphous silicon carbide antireflective coating is a film represented by the formula $Si_vC_xN_uH_yF_z$, wherein v+x+u+y+z=100%, v is from 1 to 35 atomic %, x is from 5 to 80 atomic %, u is from 0 to 50 atomic %, y is from 10 to 50 atomic % and z is from 0 to 15 atomic %.

10 Claims, 3 Drawing Sheets

(51) Int. Cl.
*H01L 21/314* (2006.01)
*H01L 31/0216* (2014.01)
*H01L 31/0236* (2006.01)
*H01L 31/04* (2014.01)

(56) References Cited

U.S. PATENT DOCUMENTS

| | | | |
|---|---|---|---|
| 6,054,206 | A | 4/2000 | Mountsier |
| 6,054,379 | A | 4/2000 | Yau et al. |
| 6,159,871 | A | 12/2000 | Loboda et al. |
| 6,171,945 | B1 | 1/2001 | Mandal et al. |
| 6,214,637 | B1 | 4/2001 | Kim et al. |
| 6,258,407 | B1 | 7/2001 | Lee et al. |
| 6,312,793 | B1 | 11/2001 | Grill et al. |
| 6,316,167 | B1 | 11/2001 | Angelopoulos et al. |
| 6,437,443 | B1 | 8/2002 | Grill et al. |
| 6,441,491 | B1 | 8/2002 | Grill et al. |
| 6,541,695 | B1 | 4/2003 | Mowles |
| 6,583,048 | B1 | 6/2003 | Vincent et al. |
| 6,583,104 | B1 | 6/2003 | Christensen et al. |
| 6,627,546 | B2 | 9/2003 | Kneer |
| 6,677,286 | B1 | 1/2004 | Rovito et al. |
| 6,726,770 | B2 | 4/2004 | Eichinger |
| 6,828,289 | B2 | 12/2004 | Peters et al. |
| 6,846,515 | B2 | 1/2005 | Vrtis et al. |
| 6,875,687 | B1 | 4/2005 | Weidman et al. |
| 6,936,405 | B2 | 8/2005 | Sabnis et al. |
| 7,402,448 | B2 | 7/2008 | Narayanan et al. |
| 7,718,888 | B2 * | 5/2010 | Cousins .................. 136/243 |
| 7,932,413 | B2 | 4/2011 | Xiao et al. |
| 2002/0142579 | A1 | 10/2002 | Vincent et al. |
| 2002/0180051 | A1 | 12/2002 | Grill et al. |
| 2003/0030057 | A1 | 2/2003 | Bencher et al. |
| 2003/0130146 | A1 | 7/2003 | Egbe |
| 2003/0148910 | A1 | 8/2003 | Peters |
| 2003/0224156 | A1 | 12/2003 | Kirner et al. |
| 2004/0048960 | A1 | 3/2004 | Peterson et al. |
| 2004/0063042 | A1 | 4/2004 | Egbe |
| 2004/0126929 | A1 | 7/2004 | Tang et al. |
| 2004/0178169 | A1 | 9/2004 | Desphande et al. |
| 2004/0241463 | A1 * | 12/2004 | Vincent et al. .................. 428/447 |
| 2004/0266637 | A1 | 12/2004 | Rovito et al. |
| 2005/0067702 | A1 | 3/2005 | America et al. |
| 2005/0287747 | A1 | 12/2005 | Chakravarti et al. |
| 2006/0045986 | A1 | 3/2006 | Hochberg et al. |
| 2006/0286774 | A1 | 12/2006 | Singh et al. |
| 2007/0151599 | A1 | 7/2007 | Cousins |
| 2009/0007966 | A1 | 1/2009 | Isaka et al. |

FOREIGN PATENT DOCUMENTS

| | | |
|---|---|---|
| EP | 0771886 A1 | 5/1997 |
| EP | 0771886 A1 * | 7/1997 |
| EP | 1127929 A2 | 8/2001 |
| EP | 1 482 070 A1 | 12/2004 |
| EP | 1 691 410 A2 | 6/2006 |
| JP | 58-095873 A2 | 6/1983 |
| JP | 60-067901 | 4/1985 |
| JP | 6196400 A2 | 7/1994 |
| JP | 10-190031 A2 | 7/1998 |
| JP | 2006-265530 A2 | 10/2006 |
| JP | 2007-051363 A2 | 3/2007 |
| KR | 2000-0067643 A | 11/2000 |
| KR | 2004-0060331 A | 7/2004 |
| KR | 2007-0005025 A | 1/2007 |
| WO | 99/41423 | 8/1999 |
| WO | 2004/044025 A2 | 5/2004 |
| WO | 2006/096247 A2 | 9/2006 |

OTHER PUBLICATIONS

Deposition of SiCN films using organic liquid materials by HWCVD method, Thin Solid Films 2005.*

Lee, J.H., et al; "Characteristics of SiOxNy Films Deposited by PECVD at Low-Temperature Using BTBAS-NH3-O2"; Journal of the Korean Physical Society; vol. 48, No. 1; Jan. 2006; pp. 89-92.

Limmanee, A., et al.; "Preparation of Hydrogenated Amorphous Silicon Carbon Nitride Films by Hot-Wire Chemical Vapor Deposition using Hexamethyldisilazane for Silicon Solar Cell Applications"; Japanese Journal of Applied Physics; vol. 46, No. 1; Jan. 1, 2007; pp. 56-59; XP001517866.

Stapinski, T., et al; "Amorphous Hydrogenated Silicon—Carbon as New Antireflective Coating for Solar Cells"; Journal of Non-Crystalline Solids; North-Holland Physics Publishing; vol. 352, No. 9-20; Jun. 15, 2006; pp. Jun. 15, 2006; XP025187579.

Zaharias, G., et al.; "Detecting Free Radicals During the Hot Wire Chemical Vapor Deposition of Amorphous Siilcon Carbide Films using Single-Source Precursors"; Journal of Vacuum Science and Technology; vol. 24, No. 3; Apr. 26, 2006; pp. 542-549; XP012090956.

Blaszczyk-Leazak, I., et al.; "Remote Hydrogen Microwave Plasma Chemical Vapor Deposition of Silicon Carbonitride Films from a (Dimethylamino) Dimethylsilane Precursor: Characterization of the Process, Chemical Structure, and Surface Morphology of the Films"; Diamond and Related Materials, Elsevier Science Publishers; vol. 15, No. 9; Sep. 1, 2006; pp. 1484-1491; XP025141324.

* cited by examiner

ANTIREFLECTIVE COATINGS FOR PHOTOVOLTAIC APPLICATIONS

CROSS-REFERENCE TO RELATED APPLICATIONS

This application claims the benefit of priority under 35 U.S.C. §119(e) to earlier filed U.S. patent application Ser. No. 60/979,585 filed on Oct. 12, 2007, the disclosure of which is incorporated herein by reference.

BACKGROUND OF THE INVENTION

This invention relates to photovoltaic devices, particularly photovoltaic devices comprising thin layers of semiconductor materials, such as thin layers of monocrystalline or multicrystalline silicon. More particularly, this invention relates to photovoltaic devices comprising an antireflective layer comprising an amorphous silicon carbide material that are highly efficient in comparison to conventionally produced cells.

Photovoltaic ("PV") cells convert light energy into electrical energy. Most photovoltaic cells are fabricated from either monocrystalline silicon or multicrystalline silicon. Silicon is generally used because it is readily available at a reasonable cost due to its use in the microelectronics industry and because it has the proper balance of electrical, physical and chemical properties for use to fabricate photovoltaic cells. During the manufacture of photovoltaic cells, silicon is typically doped with a dopant of either positive or negative conductivity type, and is typically cut into thin substrates, usually in the form of wafers or ribbons, by various methods known in the art. Throughout this application, the surface of the substrate, such as a wafer, intended to face incident light is designated as the front surface and the surface opposite the front surface is referred to as the back surface. By convention, positive conductivity type is commonly designated as "p" and negative conductivity type is designated as "n." In this application, "p" and "n" are used only to indicate opposing conductivity types. In this application, "p" and "n" mean positive and negative respectively but can also mean negative and positive respectively. The key to the operation of a photovoltaic cell is the creation of a p-n junction, usually formed by further doping the front surface of the silicon substrate to form a layer of opposite conductivity type from the doped silicon substrate. Such a layer is commonly referred to as the emitter layer. In the case of a p-doped substrate, the emitter layer would be formed by doping the front surface with an n-type dopant. The p-n junction is the interface between the p-doped region and the n-doped region. The p-n junction allows the migration of electron-hole pairs in response to incident photons which causes a potential difference across the front and back surfaces of a substrate wafer.

Fabrication of a photovoltaic cell generally begins with a p-doped substrate. The substrate, typically in the form of a wafer, is then exposed to an n-dopant to form an emitter layer and a p-n junction. Typically, the n-doped layer is formed by first depositing an n-dopant onto the surface of the substrate using techniques commonly employed in the art such as, for example, spray on, spin on, chemical vapor deposition, or other deposition methods. After deposition of the n-dopant upon the substrate surface, the n-dopant is driven into the surface of the silicon substrate to further diffuse the n-dopant into the substrate surface (the n-doped layer is commonly referred to as an "emitter" layer). This "drive-in" step is commonly accomplished by exposing the wafer to heat, often in combination with a gas stream comprising oxygen, nitrogen, steam, or a combination thereof. A p-n junction is thereby formed at the boundary region between the n-doped layer and the p-doped silicon substrate, which allows the charge carriers to migrate in response to incident light.

Efficiency of a photovoltaic cell is determined by the capacity of the cell to convert incident light energy into electrical energy. Several modifications to the design and production of photovoltaic cells have been developed to increase conversion efficiency including the use of texturing, antireflective coatings, surface passivation, and back surface fields.

Texturing of a photovoltaic cell reduces reflection of incident light by the photovoltaic cell surface. By reducing reflection, more incident light is available for conversion by the photovoltaic cell. Texturing is typically accomplished by chemical etching and in particular by anisotropic etching of the silicon substrate.

Antireflective coatings are typically applied on textured surfaces to further reduce the reflection of incident light at the photovoltaic cell surface. The interface between the antireflective coating and the emitter layer of a photovoltaic device is critical in the overall performance of the device. For example, gaps or any other type of defect at this interface can adversely affect the efficient collection of charge. Prior art antireflective coatings such as, for example, oxides or silicon nitride are prone to formation of defects at this interface because of the high temperatures and plasma powers that are needed to deposit these materials. Accordingly, there is a need in the art for an antireflective coating that does not suffer from the above-mentioned drawbacks.

BRIEF SUMMARY OF THE INVENTION

The present invention satisfies this need by providing a process for making a photovoltaic device comprising a silicon substrate comprising a p-n junction, the process comprising the steps of: forming an amorphous silicon carbide antireflective coating over at least one surface of the silicon substrate by chemical vapor deposition of a composition comprising a precursor selected from the group consisting of an organosilane, an aminosilane, and mixtures thereof, wherein the amorphous silicon carbide antireflective coating is a film represented by the formula $Si_vC_xN_uH_yF_z$, wherein $v+x+u+y+z=100\%$, v is from 1 to 35 atomic %, x is from 5 to 80 atomic %, u is from 0 to 50 atomic %, y is from 10 to 50 atomic % and z is from 0 to 15 atomic %.

In another aspect, the present invention provides photovoltaic cell comprising: a silicon substrate comprising a p-n junction; and an amorphous silicon carbide antireflective coating represented by the formula $Si_vC_xN_uH_yF_z$, wherein $v+x+u+y+z=100\%$, v is from 1 to 35 atomic %, x is from 5 to 80 atomic %, u is from 0 to 50 atomic %, y is from 10 to 50 atomic % and z is from 0 to 15 atomic %.

DETAILED DESCRIPTION OF THE INVENTION

Figure 1:
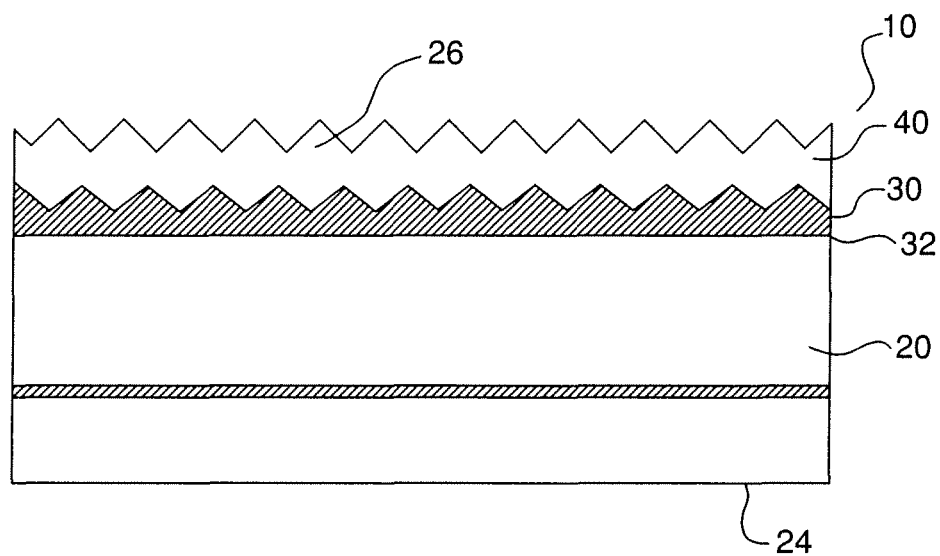
FIG. 1 shows a schematic cross-section view of an embodiment of a photovoltaic cell according to the present invention.

The present invention provides a process for making a photovoltaic device comprising a silicon substrate comprising a p-n junction, the process comprises the steps of: forming an amorphous silicon carbide antireflective coating over at least one surface of the silicon substrate by chemical vapor deposition of a composition comprising a precursor selected from the group consisting of an organosilane, an aminosilane, and mixtures thereof, wherein the amorphous silicon carbide antireflective coating is a film represented by the formula $Si_vC_xN_uH_yF_z$, wherein v+x+u+y+z=100%, v is from 1 to 35 atomic %, x is from 5 to 80 atomic %, u is from 0 to 50 atomic %, y is from 10 to 50 atomic % and z is from 0 to 15 atomic %. As used herein, the term "amorphous silicon carbide antireflective coating" represented by the formula $Si_vC_xN_uH_yF_z$ as defined above also includes amorphous silicon carbo-nitride when nitrogen is present in the film (i.e., when "u" is greater than 0). Also as used herein, the term "photovoltaic device" means a solid-state electrical device that converts light directly into direct current electricity of voltage-current characteristics that are a function of the characteristics of the light source and the materials in and design of the device. The term "photovoltaic device" includes a photovoltaic cell but is not necessarily limited thereto.

In one embodiment, a photovoltaic device such as, for example, a photovoltaic cell according to the present invention is fabricated using a boron doped substrate comprising silicon, typically in the form of a wafer or a ribbon. The substrate can comprise monocrystalline silicon and the substrate can comprise multicrystalline silicon. As used herein, "silicon" includes monocrystalline silicon and multicrystalline silicon unless expressly noted. One or more layers of additional material; for example, germanium, may be disposed over the substrate surface or incorporated into the substrate if desired. Although boron is widely used as the p-type dopant, other p-type dopants such as, for example, gallium or indium, can also be employed.

Wafers are typically obtained by slicing silicon ingots, vapor phase deposition, liquid phase epitaxy or other known methods. Slicing can be via inner-diameter blade, continuous wire or other known sawing methods. Although the substrate can be cut into any generally flat shape, wafers are typically circular in shape. Generally, such wafers are typically less than about 400 micrometers thick. Preferably, substrates of the present invention are less than about 200 micrometers thick, more preferably less than about 150 micrometers thick, still more preferably less than about 100 micrometers thick, and most preferably less than about 50 micrometers thick. Typically, the substrates are at least about 10 micrometers and, more preferably about 20 micrometers thick. Substrates employed in the present invention are typically cut from a cylindrical silicon block having a diameter in the range of from about 100 mm to 200 mm.

Before further processing, the substrate is preferably cleaned to remove any surface debris and cutting damage. Typically, this includes placing the substrate in a wet chemical bath such as, for example, a solution comprising any one of a base and peroxide mixture, an acid and peroxide mixture, a NaOH solution, or several other solutions known and used in the art. The temperature and time required for cleaning depends on the specific solution employed. For example, a 25 wt % to 35 wt % aqueous NaOH solution can be used at a temperature in the range of about 75 to 95° C. for about 20 to about 70 seconds.

Optionally (especially for monocrystalline substrates), the substrate is texturized by, for example, anisotropic etching of the crystallographic planes. Texturing is commonly in the form of pyramid-shapes depressed or projected from the substrate surface. The height or depth of the pyramid-shapes is typically from about 4 to about 7 micrometers. For a typical substrate with a 100 orientation, a low concentration aqueous NaOH solution at elevated temperature is typically employed to anisotropically etch the 100 plane revealing a 111 orientation plane in pyramid-shape projections. As used in this application, a "low concentration" solution means, preferably, a concentration of solute less than about 7 wt %. "Elevated temperature" as used herein means, preferably, a temperature greater than about 80° C. Under such conditions, for example, a substrate would be placed in the solution for about 10 to about 30 minutes.

An emitter layer is formed typically by doping the substrate with an n-type dopant. N-doping can be accomplished by depositing the n-dopant onto the substrate and then heating the substrate to "drive" the n-dopant into the substrate. Gaseous diffusion can be used to deposit the n-dopant onto the substrate surface. Other methods can also be used, however, such as, for example, ion implantation, solid state diffusion, or other methods used in the art to create an n-doped layer and a shallow p-n junction proximal to the substrate surface. Phosphorus is a preferred n-dopant, but any suitable n-dopant can be used alone or in combination such as, for example, arsenic, antimony or lithium. Typically, a plurality of substrates are placed in a tray such that the front and back surfaces and the edges of the substrate are exposed to the n-dopant. By application of this method, an emitter layer and p-n junction created in the n-doping process are formed along all of the surfaces of the substrate.

The depth of the n-doped layer at the front surface is typically greater than about 0.1 micrometer, preferably greater than about 0.2 micrometers and is typically less than about 0.5 micrometers, and preferably less than about 0.3 micrometers. The surface dopant concentration of the emitter layer at the front surface is preferably greater than about $10^{18}$ atoms/cm$^3$, more preferably greater than about $10^{19}$ atoms/cm$^3$. The surface dopant concentration of the emitter layer at the front surface can be as high as saturation, but is typically less than about $10^{22}$ atoms/cm$^3$, more preferably less than about $10^{21}$ atoms/cm$^3$, most preferably the surface dopant concentration of the emitter layer is about $10^{20}$ atoms/cm$^3$. The n-doping process typically creates a layer of silicon oxide on the surfaces of the wafer, which is typically removed prior to application of an antireflective coating in favor of a coating. The silicon oxide can be removed through, for example, chemical etching in a wet chemical bath, typically a low concentration HF solution at ambient temperature for about 10 to about 40 seconds.

The method of the present invention includes the step of forming an amorphous silicon carbide antireflective coating over at least one surface of the silicon substrate by chemical vapor deposition of a composition comprising a precursor selected from the group consisting of an organosilane, an aminosilane, and mixtures thereof. As used herein, the phrase "forming an amorphous silicon carbide antireflective coating over at least one surface of the silicon substrate" is not restricted to the amorphous silicon carbide layer being directly over and in contact with the at least one surface of the silicon substrate it is disposed over. Other intervening materials or layers may be present. Examples of such other intervening materials or layers include materials and layers typically found in a photovoltaic cell such as, for example, a transparent conductor layer and a grid conductor layer.

The amorphous silicon carbide antireflective coating according to the present invention is preferably a film represented by the formula $Si_vC_xN_uH_yF_z$, wherein v+x+u+y+z=100%, v is from 1 to 35 atomic %, x is from 5 to 80 atomic %, u is from 0 to 50 atomic %, y is from 10 to 50 atomic % and z is from 0 to 15 atomic %. The antireflective coating according to the present invention is preferably formed by the chemical vapor deposition of a composition comprising (1) at least one precursor selected from the group consisting of an organosilane, an aminosilane, and mixtures thereof; and optionally (2) a hydrocarbon, wherein the hydrocarbon is not removed from the antireflective coating after deposition.

The following are non-limiting examples of the at least one precursor selected from the group consisting of an organosilane, an aminosilane, and mixtures thereof, which is suitable for use according to embodiments of the present invention that are suitable to form an amorphous silicon carbide antireflective layer either with or without a distinct hydrocarbon. In the chemical formulas which follow and in all chemical formulas throughout this document, the term "independently" should be understood to denote that the subject R group is not only independently selected relative to other R groups bearing different superscripts, but is also independently selected relative to any additional species of the same R group. For example, in the formula $R^1{}_n R^2{}_{4-n} Si$, when n is 2 or 3, the two or three $R^1$ groups need not be identical to each other or to $R^2$.

The following are formulas representing certain Si-based precursors suitable for use with a distinct light absorber to form an amorphous silicon carbide and/or silicon carbo-nitride antireflective coating according to the present invention:

(a) cyclic silazane compounds of the formula $(NR_1SiR_1R_3)_x$, where $R^1$ and $R^3$ are independently H, $C_1$ to $C_4$, linear or branched, saturated, singly or multiply unsaturated, cyclic, partially or fully fluorinated; and x is an integer from 2 to 8;

(b) cyclic carbosilane compounds of the formula $(CR_1R_3SiR_1R_3)_x$, where $R^1$ and $R^3$ are independently H, $C_1$ to $C_4$, linear or branched, saturated, singly or multiply unsaturated, cyclic, partially or fully fluorinated; and x is an integer from 2 to 8;

(c) non-cyclic alkyl silanes of the formula $(R_{1n}R_{2m}R_{3o}R_{4p})Si$—$H_{4-t}$, where $R_1$ to $R_4$ can be $C_1$ to $C_4$ linear or branched, saturated, singly or multiply unsaturated, cyclic, partially or fully fluorinated; and t=n+m+o+p and t=1 to 4;

(d) compounds of the formula $R^1{}_n(NR^2)_{4-n}Si$, where $R^1$ is independently H or $C_1$ to $C_4$ linear or branched, saturated, singly or multiply unsaturated, cyclic, partially or fully fluorinated hydrocarbon; $R^2$ is independently $C_1$ to $C_6$ linear or branched, saturated, singly or multiply unsaturated, cyclic, aromatic, partially or fully fluorinated hydrocarbon; and n is 0 to 3;

(e) compounds of the formula $R^1{}_n(NR^2)_{3-n}Si$—$SiR^3{}_m(NR^4)_{3-m}$ where $R^1$ and $R^3$ are independently H or $C_1$ to $C_4$ linear or branched, saturated, singly or multiply unsaturated, cyclic, partially or fully fluorinated hydrocarbon; $R^2$ and $R^4$ are independently $C_1$ to $C_6$ linear or branched, saturated, singly or multiply unsaturated, cyclic, aromatic, partially or fully fluorinated hydrocarbon; and n is 0 to 3, m is 0 to 3;

(f) compounds of the formula $R^1{}_n(NR^2)_{3-n}Si$—$R^5$—$SiR^3{}_m(NR^4)_{m-3}$ where $R^1$ and $R^3$ are independently H or $C_1$ to $C_4$ linear or branched, saturated, singly or multiply unsaturated, cyclic, partially or fully fluorinated hydrocarbon; $R^2$, $R^4$ and $R^5$ are independently $C_1$ to $C_6$ linear or branched, saturated, singly or multiply unsaturated, cyclic, aromatic, partially or fully fluorinated hydrocarbon, alternatively, $R^5$ is an amine or an organoamine group; n is 0 to 3; and m is 0 to 3;

(g) compounds of the formula $(R^1{}_n(NR^2)_{3-n}Si)_tCH_{4-t}$ where $R^1$ is independently H or $C_1$ to $C_4$ linear or branched, saturated, singly or multiply unsaturated, cyclic, partially or fully fluorinated hydrocarbon; $R^2$ is independently $C_1$ to $C_6$ linear or branched, saturated, singly or multiply unsaturated, cyclic, aromatic, partially or fully fluorinated hydrocarbon; n is 0 to 3; and t is 1 to 3; and (h) the formula $(R^1{}_n(NR^2)_{3-n}Si)_tNH_{3-t}$ where $R^1$ is independently H or $C_1$ to $C_4$ linear or branched, saturated, singly or multiply unsaturated, cyclic, partially or fully fluorinated hydrocarbon; $R^2$ is independently $C_1$ to $C_6$ linear or branched, saturated, singly or multiply unsaturated, cyclic, aromatic, partially or fully fluorinated hydrocarbon; and n is 0 to 3.

In embodiments where the precursor employed is an organosilane, preferred organosilanes are non-cyclic alkyl silanes of the formula $(R_{1n}R_{2m}R_{3o}R_{4p})Si$—$H_{4-t}$, where $R_1$-$R_4$ can be $C_1$-$C_4$ linear or branched, saturated, singly or multiply unsaturated, cyclic, partially or fully fluorinated and t=n+m+o+p and t=1 to 4. Examples of such organosilanes include monomethylsilane, dimethylsilane, trimethylsilane, and tetramethylsilane. In embodiments where the precursor employed is an aminosilane, a preferred aminosilane is bis(tertiarybutylamino)silane.

In certain embodiments, the above precursors may be mixed with light absorber or have attached light absorbing substituents, and may be mixed with other molecules of these classes and/or with molecules of the same classes. In other embodiments, the above precursors are employed as the sole components of the composition, i.e., without additional light absorbing molecules.

As mentioned above, hydrocarbons are optional components of the composition comprising the at least one precursor. The hydrocarbon functions to provide a species that absorbs light. Whether a species absorbs light at wavelengths less than 400 nm is measured by the ability of the resultant film to minimize light from being reflected such as, for example, back out of the photovoltaic device, yet be essentially transparent at higher wavelengths where the device absorbs light creating hole-electron pairs. Light absorption can be measured by any of a number of tools known in the art such as, for example, spectrophotometers, reflectometers and ellipsometers. Light absorption may also be interpreted as the imaginary portion of the refractive index. In some embodiments of the present invention, the hydrocarbon is an organic hydrocarbon and is distinct from the organosilane and the aminosilane. In preferred embodiments of the present invention, the organic hydrocarbon consists of only carbon and hydrogen atoms.

The following are non-limiting examples of hydrocarbons that are suitable for use in embodiments of the present invention wherein the hydrocarbon is distinct from the at least one precursor selected from the group consisting of an organosilane. In other words, the following compounds are suitable for use as light absorbers according to the invention:

1) Cyclic hydrocarbons of the general formula $C_nH_{2n}$ where n=4-14, where the number of carbons in the cyclic structure is between 4 and 12, and where there can be a plurality of simple or branched hydrocarbons substituted onto the cyclic structure. Examples include: cyclohexane, trimethylcyclohexane, 1-methyl-4(1-methylethyl)cyclohexane, cyclooctane, methylcyclooctane, cyclooctene, cyclooctadiene, cycloheptene, cyclopentene, cyclohexene, and 1,5,9-cyclododecatriene.

2) Linear or branched, saturated, singly or multiply unsaturated hydrocarbons of the general formula $C_nH_{(2n+2)-2y}$ where n=2-20 and where y=-units of unsaturation. Examples include: ethylene, propylene, acetylene, neohexane, etc.

3) Singly or multiply unsaturated cyclic hydrocarbons of the general formula $C_nH_{2n-2x}$ where x is the number of unsaturated sites in the molecule, n=4-14, where the number of carbons in the cyclic structure is between 4 and 10, and where there can be a plurality of simple or branched hydrocarbons substituted onto the cyclic structure. The unsaturation can be located inside endocyclic or on one of the hydrocarbon substituents to the cyclic structure. Examples include cyclohexene, vinylcyclohexane, dimethylcyclohexene, t-butylcyclohexene, alpha-terpinene, pinene, 1,5-dimethyl-1,5-cyclooctadiene, vinyl-cyclohexene, etc.

4) Bicyclic hydrocarbons of the general formula $C_nH_{2n-2}$ where n=4-14, where the number of carbons in the bicyclic structure is between 4 and 12, and where there can be a plurality of simple or branched hydrocarbons substituted onto the cyclic structure. Examples include, norbornane, spirononane, decahydronaphthalene, etc.

5) Multiply unsaturated bicyclic hydrocarbons of the general formula $C_nH_{2n-(2+2x)}$ where x is the number of unsaturated sites in the molecule, n=4-14, where the number of carbons in the bicyclic structure is between 4 and 12, and where there can be a plurality of simple or branched hydrocarbons substituted onto the cyclic structure. The unsaturation can be located inside endocyclic or on one of the hydrocarbon substituents to the cyclic structure. Examples include camphene, norbornene, norbornadiene, etc.

6) Tricyclic hydrocarbons of the general formula $C_nH_{2n-4}$ where n=4-14, where the number of carbons in the tricyclic structure is between 4 and 12, and where there can be a plurality of simple or branched hydrocarbons substituted onto the cyclic structure. An example is adamantane.

In another embodiment of the present invention, the at least one precursor and the light absorbing precursor are not necessarily different molecules and, in certain embodiments, the light absorber is a part of (e.g., covalently bound to) the structure-forming precursor. Precursors containing light absorbers bound to them are sometimes referred to herein as "light absorbing precursors." Having the light absorber attached to the silicon-containing at least one precursor may be advantageous in achieving a higher efficiency of incorporation of light absorber into the film during the deposition process. Furthermore, it may also be advantageous to have two light absorbers attached to one Si in the precursor, such as in diphenyl-diethylsilane, or two Si atoms attached to one light absorber, such as in 1,4-bis(diethylsilyl)cyclohex-2,5-diene, because a likely bond to break in a plasma during the deposition process is the Si-carbon bond. In this manner, reaction of one Si—C (i.e., Si-hydrocarbon) bond in the plasma will result in incorporation of the light absorbing character in the deposited film.

The following are non-limiting examples of such Si-based precursors having light absorbing capability. In the following examples, the light absorbing function is attributed to one or more of $R^1$, $R^2$, $R^3$, $R^4$, or $R^7$:

a) $R^1_n(NR^2)_{4-n}Si$ where $R^1$ is H or $C_1$ to $C_{12}$ linear or branched, saturated, singly or multiply unsaturated, cyclic, partially or fully fluorinated hydrocarbon; $R^2$ is a $C_1$ to $C_{12}$, linear or branched, saturated, singly or multiply unsaturated, cyclic, aromatic, partially or fully fluorinated; and n is 0 to 4 (Examples: dimethylamino-t-butyl-neo-hexylsilane, and diethyl-neo-hexylsilane);

b) $R^1_n(NR^2)_{3-n}Si$—$SiR^3_m(NR^4)_{m-3}$ where $R^1$ and $R^3$ are independently H or $C_1$ to $C_{12}$ linear or branched, saturated, singly or multiply unsaturated, cyclic, partially or fully fluorinated hydrocarbon; $R^2$ and $R^4$ are independently a $C_1$ to $C_{12}$ linear or branched, saturated, singly or multiply unsaturated, cyclic, aromatic, partially or fully fluorinated hydrocarbon, n is 0 to 3, m is 0 to 3 (Examples: 1,2-dipropylamino-1, 2-di-t-butyl-1-neohexyldisilane, and 1,2-diethyl-1-neohexyldisilane);

c) cyclic silazanes of the formula $(NR_1SiR_1R_3)_x$, where $R^1$ and $R^3$ are independently H or $C_1$ to $C_{12}$ linear or branched, saturated, singly or multiply unsaturated, cyclic, partially or fully fluorinated hydrocarbon, and x is any integer from 2 to 8, provided that at least one of $R^1$ and $R^3$ is substituted with a $C_3$ or larger hydrocarbon;

d) cyclic carbosilanes of the formula $(CR_1R_3SiR_1R_3)_x$, where $R^1$ and $R^3$ are independently H or $C_1$ to $C_{12}$ linear or branched, saturated, singly or multiply unsaturated, cyclic, partially or fully fluorinated hydrocarbon, and x is any integer from 2 to 8, provided that at least one of $R^1$ and $R^3$ is substituted with a $C_3$ or larger hydrocarbon;

e) $R^1_n(NR^4)_{3-n}Si$—$R^5$—$SiR^3_m(NR^4)_{m-3}$ where $R_1$ and $R^3$ are independently H or $C_1$ to $C_{12}$ linear or branched, saturated, singly or multiply unsaturated, cyclic, partially or fully fluorinated hydrocarbon; $R^2$, $R^4$, $R^5$, are independently $C_1$ to $C_{12}$ linear or branched, saturated, singly or multiply unsaturated, cyclic, aromatic, partially or fully fluorinated hydrocarbon, alternatively, $R^5$ is an amine or an organoamine group, n is 0 to 3, m is 0 to 3;

f) $(R^1_n(NR^2)_{3-n}Si)_tCH_{4-t}$ where $R^1$ is independently H or $C_1$ to $C_{12}$ linear or branched, saturated, singly or multiply unsaturated, cyclic, partially or fully fluorinated hydrocarbon; $R^2$ is independently $C_1$ to $C_{12}$ linear or branched, saturated, singly or multiply unsaturated, cyclic, aromatic, partially or fully fluorinated hydrocarbon, n is 0 to 3, and t is 1 to 3, provided that at least one of $R^1$ is substituted with a $C_3$ or larger hydrocarbon.

g) $(R^1_n(NR^3)_{3-n}Si)_tNH_{3-t}$ where $R^1$ is independently H or $C_1$ to $C_{12}$ linear or branched, saturated, singly or multiply unsaturated, cyclic, partially or fully fluorinated hydrocarbon; $R^2$ and $R^3$ are independently $C_1$ to $C_{12}$ linear or branched, saturated, singly or multiply unsaturated, cyclic, aromatic, partially or fully fluorinated hydrocarbon, n is 0 to 3, p is 0 to 3 and t is 1 to 3, provided that at least one of $R^1$ is substituted with a $C_3$ or larger hydrocarbon;

h) cyclic silazanes of the formula $(NR_1Si(R_2)_a(R_3)_b(NR_4)_c)x$, where $R^1$, $R^2$, and $R^3$ are independently H or $C_1$ to $C_{12}$ linear or branched, saturated, singly or multiply unsaturated, cyclic, partially or fully fluorinated hydrocarbon, and x is any integer from 2 to 8, a, b, and c are from 0 to 2 and a+b+c=2, provided that at least one of $R^1$ and $R^3$ is substituted with a $C_3$ or larger hydrocarbon; and i) cyclic carbosilanes of the formula $(CR_1R_3Si(R_2)_b(NR_3)_c)x$, where $R^1$, $R^2$, and $R^3$ are independently H or $C_1$ to $C_{12}$ linear or branched, saturated, singly or multiply unsaturated, cyclic, partially or fully fluorinated hydrocarbon, and x is any integer from 2 to 8, b, and c are from 0 to 2 and b+c=2, provided that at least one of $R^1$, $R^2$ and $R^3$ is substituted with a $C_3$ or larger hydrocarbon.

It is preferred that at least one of $R^1$, $R^3$ and $R^7$ have a $C_3$ or larger hydrocarbon to act as light absorber, and an optional post-treatment process may be used to modify at least a portion of the light absorber. In preferred embodiments of the present invention each of $R^1$, $R^2$, $R^3$, $R^4$, and $R^7$ in the formulas above are either hydrogen or a $C_5$ to $C_7$ hydrocarbon group.

The above precursors may be mixed with other molecules of these same classes and/or with molecules of the same classes except where n and/or m are from 0 to 3.

In all of the above-described embodiments, the hydrocarbon (i.e., the light-absorbing component) is substantially not removed from the antireflective coating. As used herein, the phrase "substantially not removed from the antireflective coating" refers to a feature of the present invention wherein carbon species from the hydrocarbon is desired to be present to participate in imparting antireflective character to the coating. Accordingly, although some carbon may be incidentally removed as a result of certain processing conditions after the amorphous silicon carbide antireflective layer has been deposited, the carbon is substantially present in the coating to absorb light at the required wavelengths.

In preferred embodiments of the present invention, the amorphous silicon carbide antireflective layer is a thin film having not only light absorbing characteristics, but also improved surface passivation properties relative to for example silicon nitride deposited form PECVD based $SiH_4$ and $NH_3$.

The antireflective coatings of the present invention are compatible with the various chemical processes used to produce photovoltaic devices, and are capable of adhering to a variety of materials, such as silicon, $SiO_2$, $Si_3N_4$, OSG, FSG, silicon carbide, hydrogenated silicon carbide, silicon nitride, hydrogenated silicon nitride, silicon carbonitride, hydrogenated silicon carbonitride, boronitride, low dielectric constant materials, photoresists, organic polymers, porous organic and inorganic materials, metals such as copper and aluminum, and diffusion barrier layers such as but not limited to TiN, Ti(C)N, TaN, Ta(C)N, Ta, W, WN or W(C)N. Such films are capable of adhering to at least one of the foregoing materials sufficiently to pass a conventional pull test, such as ASTM D3359-95a tape pull test, wherein a sample is considered to have passed the test if there is no discernible removal of film.

Preferably, the amorphous silicon carbide antireflective coating of the present invention is deposited to a thickness of from about 0.002 to about 10 microns, although the thickness can be varied as required and multiple layers can be applied. The blanket film deposited on a non-patterned surface has excellent uniformity, with a variation in thickness of less than 2% over 1 standard deviation across the substrate with a reasonable edge exclusion, wherein e.g., a 5 mm outermost edge of the substrate is not included in the statistical calculation of uniformity.

Preferably, the amorphous silicon carbide antireflective coatings according to the present invention have a refractive index between 1.0 and 4.0 and, more preferably, between 1.7 and 2.3. Improved reflectivity over a range of wavelengths can be achieved with two or more films. For example, the more layers of the antireflective coating according to the present invention, the greater the range of wavelengths over which the reflectivity can be minimized. Typically with multiple layers, each layer will have a different refractive index. The absorptivity of the film also can be increased by altering the chemistry and deposition conditions for the film, as well as with optional post-treatments in order to tailor the film properties for the particular application.

Antireflective coatings of the present invention do not require the use of an oxidant during deposition of the film. The absence of added oxidant to the gas phase, which is defined for present purposes as a moiety that could oxidize organic groups (e.g., $O_2$, $N_2O$, ozone, hydrogen peroxide, NO, $NO_2$, $N_2O_4$, or mixtures thereof), may facilitate the retention of the desired light absorbing species in the film. This allows the incorporation of the desired amount of carbon necessary to provide desired properties, such as light absorptivity and surface passivation.

The precursors can be carried into the reactor separately from distinct sources or as a mixture. The precursors can be delivered to the reactor system by any number of means, preferably using a pressurized stainless steel vessel fitted with the proper valves and fittings to allow the delivery of liquid to the process reactor.

In certain embodiments, mixtures of different precursors such as, for example, organosilanes and/or aminosilanes, are used in combination. It is also within the scope of the invention to use combinations of multiple different light absorbers, and organosilanes and/or aminosilanes in combination with, for example, organosilane and/or aminosilanes species with attached light absorbers. Such embodiments facilitate adjusting the ratio of light absorber to Si in the final product, and/or enhance one or more critical properties of the structure.

In addition to the structure forming species and the light absorbing species, additional materials can be charged into the vacuum chamber prior to, during and/or after the deposition reaction. Such materials include, e.g., inert gas (e.g., He, Ar, $N_2$, Kr, Xe, etc., which may be employed as a carrier gas for lesser volatile precursors and/or which can promote the curing of the as-deposited materials and provide a more stable final film) and reactive substances, such as gaseous or liquid organic substances, $NH_3$, and $H_2$, are the preferred carrier gas.

Energy is applied to the gaseous reagents to induce the gases to react and to form the film on the substrate. Such energy can be provided by (depending on the method employed), e.g., thermal, plasma, pulsed plasma, helicon plasma, high density plasma, inductively coupled plasma, and remote plasma methods. A secondary rf frequency source can be used to modify the plasma characteristics at the substrate surface. Preferably, the coating is formed by plasma enhanced chemical vapor deposition. It is particularly preferred to generate a capacitively coupled plasma at a frequency of 13.56 MHz. Plasma power is preferably from 0.02 to 7 watts/cm$^2$, more preferably 0.3 to 3 watts/cm$^2$, based upon a surface area of the substrate. It may be advantageous to employ a carrier gas which possesses a low ionization energy to lower the electron temperature in the plasma which in turn will cause less fragmentation in the silicon based precursor and light absorber. Examples of this type of low ionization gas include $NH_3$, $CH_4$, Ar, Xe, Kr.

The flow rate for each of the gaseous reagents preferably ranges from 10 to 5000 sccm, more preferably from 30 to 1000 sccm, per single 200 mm wafer. The individual rates are selected so as to provide the desired amounts of structure-former and light absorber in the film. The actual flow rates needed may depend upon wafer size and chamber configuration, and are in no way limited to 200 mm wafers or single wafer chambers.

Although the benefits of the antireflective coating of the present invention have been demonstrated in connection with depositing a passivating antireflective coating, one of ordinary skill in the art will understand that the antireflective coatings of the present invention can be employed in connection with passivation of other substrates such as, for example, silicon, aluminum, metals, metal oxides, and barrier materials.

After the amorphous silicon carbide antireflective coating according to the present invention is formed, the substrate is subjected to back surface etching to remove the p-n junction. The amorphous silicon carbide antireflective coating acts as a mask for the surfaces over which the antireflective coating is applied and, therefore, limits the etching to the uncoated portion of the substrate. Back surface etching is generally accomplished by placing the substrate in a chemical bath to remove the n-doped region from the back surface. The type of chemical used, the temperature of the bath and the time the substrate is kept in the bath are dependant upon the material used for the substrate. For example, a 30 wt % aqueous NaOH bath at a temperature in the range of from about 80° C. to about 92° C. can be used for either monocrystalline or multicrystalline silicon. A monocrystalline silicon substrate would be exposed, for example, to the bath for about 80 seconds to about 100 seconds. A multicrystalline silicon substrate would generally be exposed to the bath for a longer period of time, for example, at least about 3 minutes and up to, for example, about 6 minutes. Any etch, and preferably a chemical etch, capable of removing the n-doped region of the back surface can be used at a temperature and for a time period that effects removal of the n-doped region of the back surface without substantial degradation of the antireflective coating. By "without substantial degradation" is meant that the antireflective coating according to the present invention remains disposed over the front face, preferably also the edges, and, preferably, the back periphery of the substrate.

After the etch to remove the p-n junction from the back surface, the substrate can be cleaned with another chemical etch for example, a 4 wt % solution of HF prior to rinsing and drying the wafer. Back surface etching results in an untextured or substantially smooth back surface. As used herein, "substantially smooth" back surface preferably means that the back surface is untextured except for the portion of the back surface, if any, over which a surface coating is disposed. "Untextured" as used herein, preferably means the absence of peaks or valleys on the substrate surface; for example, the absence of anisotropic etch surface topography or, as further example, having a surface topography consistent with isotropic etching. Back surface etching also results in a back surface which is free or substantially free of n-dopant and free or substantially free of a p-n junction. As used herein, "substantially free of n-dopant" preferably means that the n-dopant has been etched from the back surface except that n-dopant may still be present at the portion of the back surface over which a surface coating is disposed. After etching, some n-dopant can be present in the unmasked region of the back surface at a substantially reduced surface concentration; for example, a surface concentration less than about $10^{15}$ atoms/$cm^3$, preferably less than about $10^{13}$ atoms/$cm^3$, more preferably less than about $10^{11}$ atoms/$cm^3$. As used herein, "substantially free of a p-n junction proximal to the back surface" means that the p-n junction proximal to the portion of the back surface over which the surface coating is not disposed is removed or rendered ineffective due to a decreased concentration of n-dopant, for example, a back surface concentration of n-dopant less than about $10^{15}$ atoms/$cm^3$, preferably less than about $10^{13}$ atoms/$cm^3$, more preferably less than about $10^{11}$ atoms/$cm^3$, where the "atoms" are the atoms of dopant.

Front and back contacts are then applied to the substrate. Typically, contacts are in the form of a conductive metal placed on or into the front and back surfaces. The contacts can be created using photolithographic methods, by laser grooving and electroless plating methods, screen printing, or any other method that provides good ohmic contact with the front and back surfaces respectively such that electric current can be drawn from the photovoltaic cell. Typically, the contacts are present in a design or pattern, for example a grid, fingers, lines, etc., and do not cover the entire front or back surface. The contacts are preferably screen printed onto the substrate using a conductive metal paste; for example, a silver paste. The contacts are typically screen printed onto one surface, allowed to dry and then printed on the opposite surface. After applying the contacts, the substrate is fired, typically at a temperature of from about 800 to about 950° C., to anneal the contacts to the substrate. Methods for adding contacts to a wafer substrate for a photovoltaic cell are known in the art.

FIG. 1 shows a cross-section of a photovoltaic cell 10 in accordance with one embodiment of the present invention. The photovoltaic cell 10 comprises a textured, boron-doped substrate 20. The texture is symbolically depicted as 26. A textured, n-doped layer 30, formed by phosphorus diffusion, is present. A p-n junction 32 is present where the boron doped substrate 20 meets the n-doped layer 30. Antireflective coating 40 according to the present invention is disposed over the n-doped layer 30 of the cell. Antireflective coating may also extend to the edges, the front surface, and the periphery of the back surface 24 of the cell.

The invention will be illustrated in more detail with reference to the following Examples, but it should be understood that the present invention is not deemed to be limited thereto.

EXAMPLES

All experiments were performed on an Applied Materials Precition-5000 system in a 200 mm DxZ chamber fitted with an Advanced Energy 2000 rf generator, using an undoped TEOS process kit. The recipe involved the following basic steps: initial set-up and stabilization of gas flows, deposition, and purge/evacuation of chamber prior to wafer removal. Thickness, refractive index, and extinction coefficient were measured on an SCI Filmtek 2000 Reflectometry.

Example 1

Silicon Carbide Film

Figure 2:
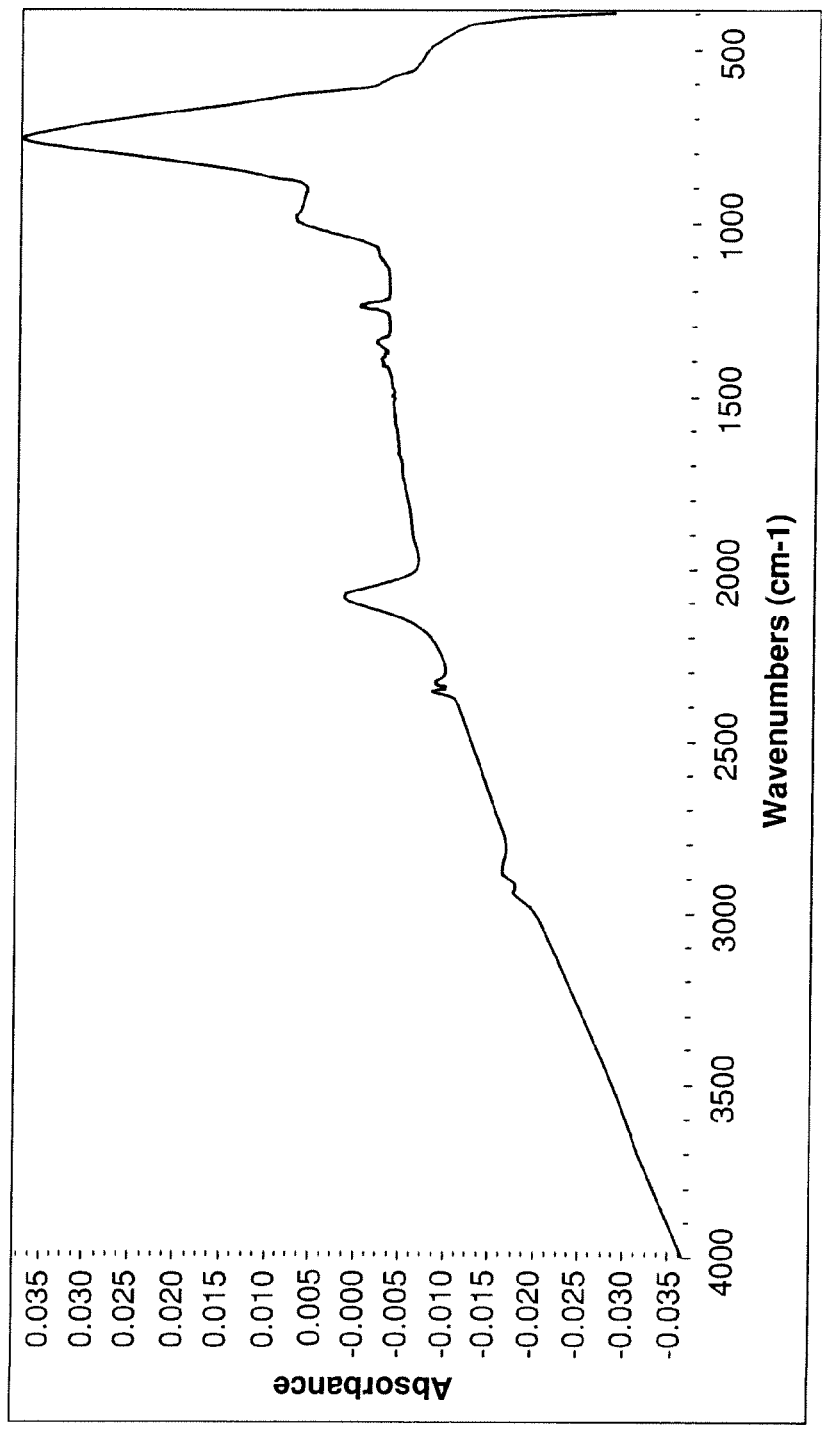
FIG. 2 is an IR spectrograph of an antireflective coating according to the present invention.

Films were deposited on silicon wafers by PECVD techniques employing organo-silanes such as, for example, trimethylsilane and tetramethyl silane (separately). The wafers were processed in a 200 mm Applied Materials DxZ PECVD chamber having a susceptor temperature in the range of from about 100° C. to about 400° C. A pressure of approximately 3 torr was used with flow rates between 50 sccm-1000 sccm. RF power (13.56 MHz) was varied between 100 W-800 W for 30-500 seconds, which produces a refractive index between 1.5-2.3. FIG. 2 is an IR spectra of the amorphous silicon carbide film showing the Si—C covalent bond at about 1200 $cm^{-1}$.

Example 2

Silicon Carbo-Nitride Film

Figure 3:
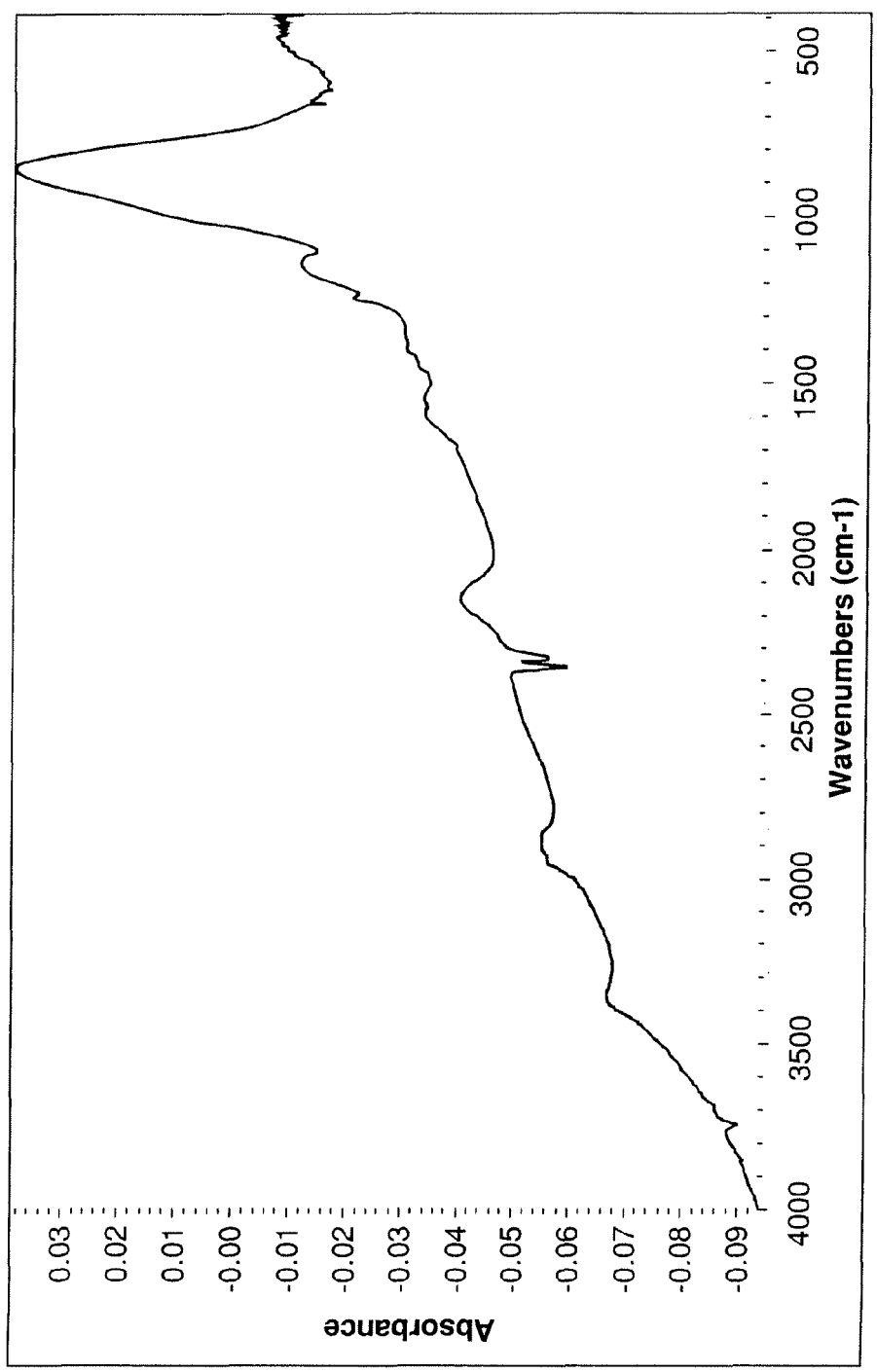
FIG. 3 is an IR spectrograph of an antireflective coating according to the present invention.

Films were deposited on silicon wafers by PECVD techniques using bis t-butylamino silane (BTBAS) with or without ammonia ($NH_3$). The wafers were processed in a 200 mm Applied Materials DxZ PECVD chamber having a susceptor temperature range of from about 100° C. to about 400° C. A pressure of approximately 2.0-4.0 torr was used with flow rates of between 50 sccm-1000 sccm. RF power (13.56 MHz) was varied between 200 W-800 W for 30-500 seconds, which produced a refractive index between 1.5-2.0. FIG. 3 is an IR spectra of the amorphous silicon carbo-nitride film showing the Si—C covalent bond at about 1200 $cm^{-1}$ and the presence of nitrogen at 3300 $cm^{-1}$.

We claim:

1. A process for making a photovoltaic device comprising a silicon substrate comprising a p-n junction, the process comprising the steps of:
    forming an amorphous silicon carbide antireflective coating over at least one surface of the silicon substrate by chemical vapor deposition of a composition comprising a precursor selected from the group consisting of
    (a) cyclic silazane compounds of the formula $(NR_1SiR_1R_3)_x$, where $R^1$ and $R^3$ are independently H, $C_1$ to $C_4$, linear or branched, saturated, singly or multiply unsaturated, cyclic, partially or fully fluorinated; and x is an integer from 2 to 8;
    (b) cyclic carbosilane compounds of the formula $(CR_1R_3SiR_1R_3)_x$, where $R^1$ and $R^3$ are independently H, $C_1$ to $C_4$, linear or branched, saturated, singly or multiply unsaturated, cyclic, partially or fully fluorinated; and x is an integer from 2 to 8;

(c) non-cyclic alkyl silanes of the formula $(R_{1n}R_{2m}R_{3o}R_{4p})Si-H_{4-t}$, where $R_1$ to $R_4$ can be $C_1$ to $C_4$ linear or branched, saturated, singly or multiply unsaturated, cyclic, partially or fully fluorinated; and t=n+m+o+p and t=1 to 4;

(d) compounds of the formula $R^1{}_n(NR^2)_{4-n}Si$, where $R^1$ is independently H or $C_1$ to $C_4$ linear or branched, saturated, singly or multiply unsaturated, cyclic, partially or fully fluorinated hydrocarbon; $R^2$ is independently $C_1$ to $C_6$ linear or branched, saturated, singly or multiply unsaturated, cyclic, aromatic, partially or fully fluorinated hydrocarbon; and n is 0 to 3;

(e) compounds of the formula $R^1{}_n(NR^2)_{3-n}Si-SiR^3{}_m(NR^4)_{3-m}$ where $R^1$ and $R^3$ are independently H or $C_1$ to $C_4$ linear or branched, saturated, singly or multiply unsaturated, cyclic, partially or fully fluorinated hydrocarbon; $R^2$ and $R^4$ are independently $C_1$ to $C_6$ linear or branched, saturated, singly or multiply unsaturated, cyclic, aromatic, partially or fully fluorinated hydrocarbon; and n is 0 to 3, m is 0 to 3;

(f) compounds of the formula $R^1{}_n(NR^2)_{3-n}Si-R^5-SiR^3{}_m(NR^4)_{m-3}$ where $R^1$ and $R^3$ are independently H or $C_1$ to $C_4$ linear or branched, saturated, singly or multiply unsaturated, cyclic, partially or fully fluorinated hydrocarbon; $R^2$, $R^4$ and $R^5$ are independently $C_1$ to $C_6$ linear or branched, saturated, singly or multiply unsaturated, cyclic, aromatic, partially or fully fluorinated hydrocarbon, alternatively, $R^5$ is an amine or an organoamine group; n is 0 to 3; and m is 0 to 3;

(g) compounds of the formula $(R^1{}_n(NR^2)_{3-n}Si)_tCH_{4-t}$ where $R^1$ is independently H or $C_1$ to $C_4$ linear or branched, saturated, singly or multiply unsaturated, cyclic, partially or fully fluorinated hydrocarbon; $R^2$ is independently $C_1$ to $C_6$ linear or branched, saturated, singly or multiply unsaturated, cyclic, aromatic, partially or fully fluorinated hydrocarbon; n is 0 to 3; and t is 1 to 3;

(h) bis(tertiarybutylamino)silane; and mixtures thereof; wherein the amorphous silicon carbide antireflective coating is a film formed without ammonia or $N_2$ and represented by the formula $Si_vC_xN_uH_yF_z$, wherein v+x+u+y+z=100%, v is from 1 to 35 atomic %, x is from 5 to 80 atomic %, u is from 0 to 50 atomic %, y is from 10 to 50 atomic % and z is from 0 to 15 atomic %.

2. The process of claim 1 wherein the substrate is texturized.

3. The process of claim 1 wherein the composition further comprises a hydrocarbon.

4. The process of claim 1 wherein the aminosilane is bis(tertiarybutylamino)silane.

5. The process of claim 3 wherein the hydrocarbon is distinct from the precursor.

6. The process of claim 1 wherein the precursor is at least one non-cyclic alkyl silane of the formula $(R_{1n}R_{2m}R_{3o}R_{4p})Si-H_{4-t}$, where $R_1$-$R_4$ can be $C_1$ to $C_4$ linear or branched, saturated, singly or multiply unsaturated, cyclic, partially or fully fluorinated; and t=n+m+o+p and t=1 to 4.

7. The process of claim 6 wherein the precursor is selected from the group consisting of: monomethylsilane, dimethylsilane, trimethylsilane, and tetramethylsilane.

8. The process of claim 7 wherein the precursor is tetramethylsilane.

9. The process of claim 3 wherein the hydrocarbon is selected from the group consisting of:
  1) cyclic hydrocarbons of the general formula $C_nH_{2n}$ where n=4-14, wherein the number of carbons in the cyclic structure is between 4 and 12;
  2) linear or branched, saturated, singly or multiply unsaturated hydrocarbons of the general formula $C_nH_{(2n+2)-2y}$, where n=2-20 and where y=units of unsaturation;
  3) singly or multiply unsaturated cyclic hydrocarbons of the general formula $C_nH_{2n-2x}$, where x is the number of unsaturated sites in the hydrocarbon molecule; and n=4-14, where the number of carbons in the cyclic structure is between 4 and 10;
  4) bicyclic hydrocarbons of the general formula $C_nH_{2n-2}$, where n=4-14, and where the number of carbons in the bicyclic structure is between 4 and 12;
  5) multiply unsaturated bicyclic hydrocarbons of the general formula $C_nH_{2n-(2+2x)}$, where x is the number of unsaturated sites in the molecule; and n=4-14, and where the number of carbons in the bicyclic structure is between 4 and 12; and
  6) tricyclic hydrocarbons of the general formula $C_nH_{2n-4}$ where n=4-14, and where the number of carbons in the tricyclic structure is between 4 and 12.

10. The process of claim 9 wherein the hydrocarbon is selected from the group consisting of: cyclohexane, trimethylcyclohexane, 1-methyl-4(1-methylethyl)cyclohexane, cyclooctane, methylcyclooctane, cyclooctene, cyclooctadiene, cycloheptene, cyclopentene, cyclohexene, 1,5,9-cyclododecatriene, ethylene, propylene, acetylene, neohexane, cyclohexene, vinylcyclohexane, dimethylcyclohexene, t-butylcyclohexene, alpha-terpinene, pinene, 1,5-dimethyl-1,5-cyclooctadiene, vinyl-cyclohexene, norbornane, spirononane, decahydronaphthalene, camphene, norbornene, norbornadiene, and adamantane.

* * * * *